United States Patent [19]

Daniele et al.

[11] 4,357,685

[45] Nov. 2, 1982

[54] METHOD OF PROGRAMMING AN ELECTRICALLY ALTERABLE NONVOLATILE MEMORY

[75] Inventors: Vincenzo Daniele, Milan; Giuseppe Corda, Saronno; Aldo Magrucci; Guido Torelli, both of Milan, all of Italy

[73] Assignee: SGS-ATES Componenti Elettronici S.p.A., Agrate Brianza, Italy

[21] Appl. No.: 168,562

[22] Filed: Jul. 14, 1980

[30] Foreign Application Priority Data

Sep. 28, 1979 [IT] Italy ................ 26071 A/79

[51] Int. Cl.³ .............................................. G11C 7/00
[52] U.S. Cl. ..................................... 365/189; 365/185
[58] Field of Search ............... 365/104, 184, 185, 189, 365/218, 163; 357/23 VT, 45

[56] References Cited

U.S. PATENT DOCUMENTS

| 3,825,946 | 7/1974 | Bentchkowsky | 357/23 |
| 4,149,270 | 4/1979 | Cricchi et al. | 365/184 |
| 4,181,980 | 1/1980 | McCoy | 365/185 |

FOREIGN PATENT DOCUMENTS

| 2028615 | 3/1980 | United Kingdom | 365/185 |
| 2029145 | 3/1980 | United Kingdom | 365/185 |

*Primary Examiner*—Stuart N. Hecker
*Attorney, Agent, or Firm*—Karl F. Ross

[57] ABSTRACT

A nonvolatile memory of the electrically alterable kind comprises an orthogonal array of cells each including a floating-gate IGFET and an enhancement IGFET in series. For the programming or the reading of a selected cell, lying at the intersection of a row and a column of the array, a common gate lead for all the enhancement IGFETs of the row and a common drain lead for all the enhancement IGFETs of the column are energized with voltage dependent on the desired kind of operation. To write a bit in a cell, its floating gate is progressively charged in a succession of steps separated by reading operations to check on the conduction threshold of the cell; the charging ends when that threshold reaches a predetermined storage level. To cancel a written bit, the floating gate is progressively discharged in a succession of steps again separated by reading operations; the discharging is terminated when the conduction threshold reaches a predetermined cancellation level. The width and/or the amplitude of a voltage pulse applied to an accessible gate of the floating-gate IGFET during the successive charging or discharging steps may be increased after each reading step in which the desired level is not attained.

5 Claims, 9 Drawing Figures

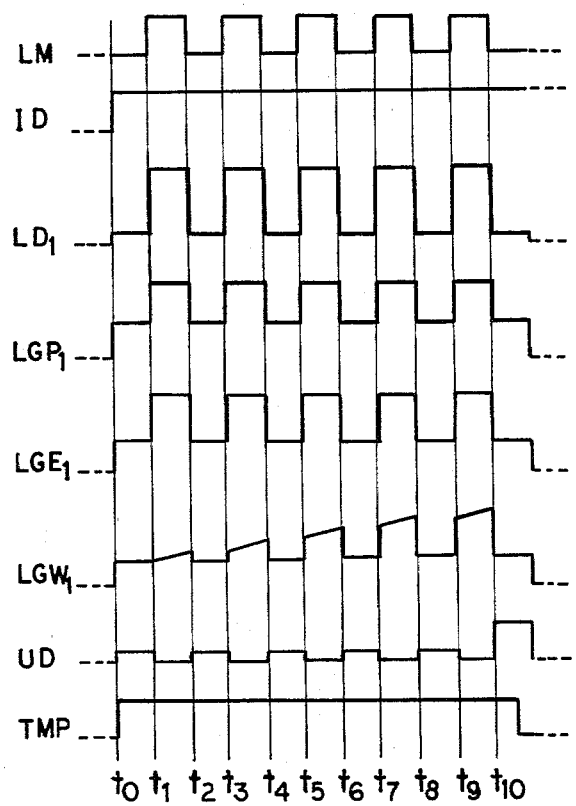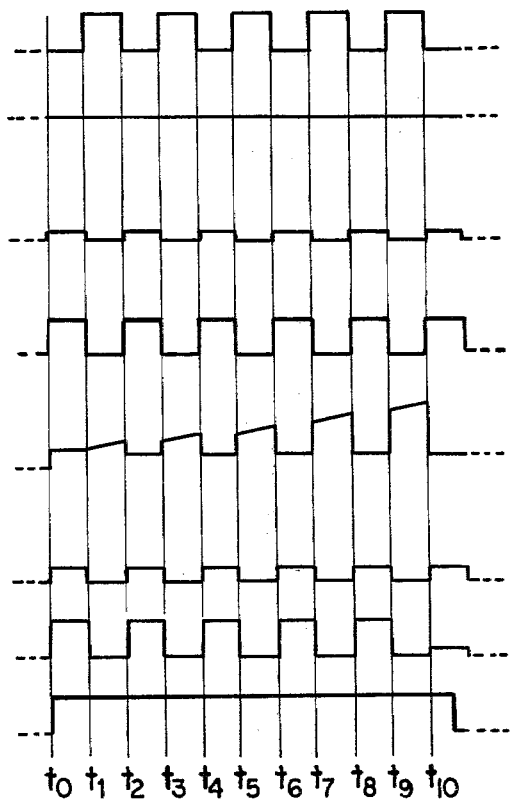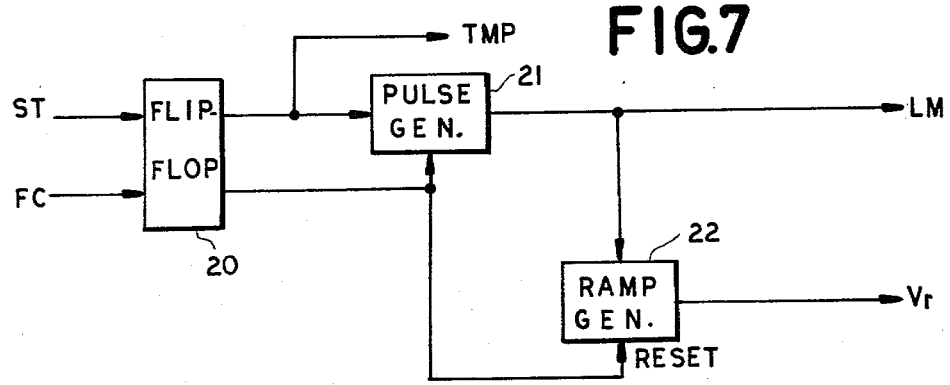

METHOD OF PROGRAMMING AN ELECTRICALLY ALTERABLE NONVOLATILE MEMORY

FIELD OF THE INVENTION

Our present invention relates to a method of programming a nonvolatile electronic memory of the type wherein a multiplicity of cells can individually read, written or charged to store a predetermined bit, such as a logical "one", and canceled or discharged to delete the bit thus stored. Our invention more particularly concerns an electrically alterable read-only memory (EAROM) whose cells comprise insulated-gate field-effect transistors (IGFETs) with so-called floating gates which can be electrically charged in a writing operation and discharged in a cancellation operation.

BACKGROUND OF THE INVENTION

IGFETs of the floating-gate type are well known in the art; see, for example, U.S. Pat. No. 3,825,946. They comprise two main electrodes, known as a "source" and a "drain", contacting respective enclaves of one conductivity type (usually n) located in a silicon substrate of the opposite conductivity type (p) at opposite ends of a channel of their own conductivity type whose resistivity depends on the electric charge of the floating gate. The latter generally consists of an insert of polycrystalline silicon embedded in a layer of silicon oxide overlying the substrate. Two accessible gates closely spaced from the inaccessible floating gate, i.e. a writing gate and a cancellation gate, are respectively coupled therewith via a relatively high and a relatively low capacitance. To charge the floating gate, the two accessible gates and the drain electrode are driven highly positive with reference to the source electrode and the substrate whereby electrons pass at high velocity through the wide-open channel and are partly attracted by way of the intervening oxide-layer portion into the floating gate. This charge increases the resistivity of the channel so that a voltage difference higher than before will be required between the two accessible gates and the source electrode in order to render the IGFET conductive.

To discharge the floating gate, the cancellation gate is driven highly positive with reference to the writing gate and the source and drain electrodes whereby a significant portion of the electrons previously accumulated in the floating gate are extracted through the portion of the oxide layer separating the cancellation gate from the floating gate. It has been found, however, that the time or the gate-biasing potential required for cancellation—i.e. for lowering the conduction threshold of the IGFET to a predetermined level—progressively increases with the number of reprogramming operations, presumably on account of a reduced conductivity of the oxide layer due to the trapping of electrons therein. This phenomenon limits the number of times a given cell can be reprogrammed before excessive time or voltage requirements render it practically unusable.

The described aging process, due not so much to length of service as to the number of writing and cancellation operations, differs for the various cells of the memory in accordance with their individual history. Thus, a cell in a virgin or near-virgin state can be discharged relatively quickly as compared with one that has undergone a large number of charge modifications. To a much lesser extent, this applies also to the time required for the writing of a cell, i.e. for the raising of the conduction threshold of its IGFET to a predetermined elevated level.

If, during reprogramming, the cancellation gate of any cell is subjected to high voltage for an excessive period, the electron population of its floating gate may be depleted to a point known as overcancellation which unduly lengthens the time required for recharging same in a writing operation. Conversely, overcharging the floating gate during writing will further lengthen the time required for subsequent cancellation and will also tend to accelerate the deterioration of the oxide layer. For these reasons, the indiscriminate charging or discharging of a plurality of cells with different histories upon reprogramming inevitably leads to an unsatisfactory performance of some of these cells and/or to a rapid obsolescence of the memory.

OBJECT OF THE INVENTION

The object of our present invention, therefore, is to provide a method of programming a nonvolatile electronic memory of the type referred to, or of a similar kind in which certain cells age more rapidly than others, that obviates the drawbacks discussed above and increases the number of reprogramming operations to which the memory can be subjected in its lifetime.

SUMMARY OF THE INVENTION

When programming or reprogramming such a memory in conformity with out present invention, we provide a two-level control voltage whose level is a measure of the value which the output voltage generated by a selected cell should have under the new program. In a first step (a) we apply to the selected cell, in the presence of that control voltage, a reading signal to determine whether a significant difference exists between the control and output voltages. If such a difference is detected, a charge-modifying potential is applied to the selected cell in a second step (b) for a time sufficient to bring its conduction threshold closer to the level corresponding to the state by which the cell can generate an output voltage of the same magnitude as the control voltage (but preferably not completely to that level). We then repeat the reading step (a) and the charge-modifying step (b) as many times as is necessary to let the difference between the two voltages substantially disappear. When this occurs, a termination signal is generated and the selected cell is left in the state last attained.

Pursuant to a more particular feature of our invention, the time of application of the charge-modifying potential and/or its magnitude may be progressively increased with successive recurrences of step (b). This is to compensate for the fact that the electron flow into or out of a storage area, such as the floating gate of an IGFET, progressively decreases as a generally exponential function of the applied potential difference.

We have also found, in accordance with a further feature of our invention, that the application of the charge-modifying potential in steps (b) can be made more effective if the reading signal utilized in steps (a) is given a higher absolute value during a charge-increasing operation (writing) than during a charge-reducing operation (cancellation).

BRIEF DESCRIPTION OF THE DRAWING

The above and other features of our invention will now be described in detail with reference to the accompanying drawing in which:

FIGS. 6A and 6B are two sets of graphs similar to FIGS. 4A and 4B but relating to the reprogramming of a cell in accordance with another aspect of our invention; and FIG. 7 is a block diagram of a voltage supply usable with the mode of operation represented by the graphs of FIGS. 6A and 6B.

SPECIFIC DESCRIPTION

Figure 1:
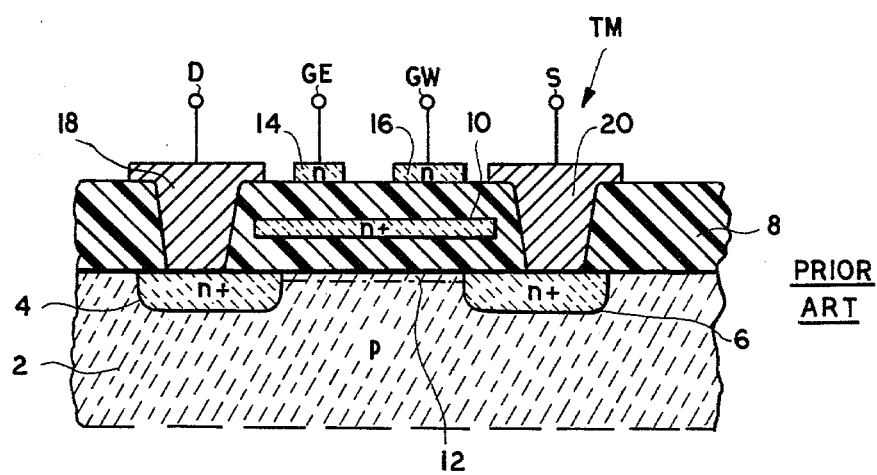
FIG. 1 is a cross-sectional view, somewhat diagrammatic and on a greatly enlarged scale, of a conventional floating-gate IGFET to which our invention is applicable.

In FIG. 1 we have illustrated part of a silicon wafer incorporating a floating-gate IGFET TM similar to that shown in FIG. 6 of the above-identified prior U.S. Pat. No. 3,825,946. This IGFET comprises a substrate 2 of p-type monocrystalline silicon with two enclaves 4 and 6 of n+ conductivity respectively constituting a drain region and a source region which are interconnected by an n-type channel 12 of variable effective thickness as schematically indicated by a phantom line. The substrate 2 is overlain by a layer 8 of silicon oxide in which there is embedded a floating gate 10 of polycrystalline silicon with n+ conductivity. Two patches 14 and 16 of n-doped polycrystalline silicon atop layer 8 respectively constitute a cancellation gate and a writing gate, the latter being of larger area than the former so as to have a greater capacitance with respect to floating gate 10. Two metallic electrodes 18 and 20 with terminals D and S penetrate the layer 8 to contact the drain and source regions 4 and 6, respectively. Cancellation gate 14 and writing gate 16 are provided with respective terminals GE and GW to which they may be linked by polycrystalline strips of the same conductivity type extending on the surface of the wafer.

Figure 2:
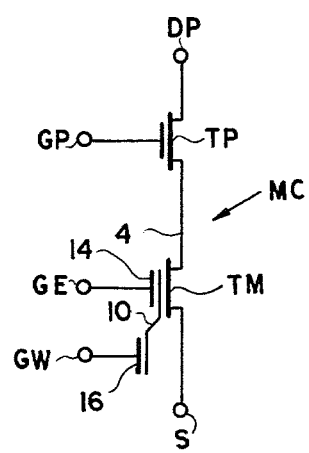
FIG. 2 is a circuit diagram of a memory cell comprising the IGFET of FIG. 1 in series with an enhancement-type IGFET.

As shown in FIG. 2, IGFET TM is serially connected, in a manner known per se, to an enhancement-type IGFET TP without floating gate formed in the same substrate. The drain region 4 of IGFET TM is merged with the source region of IGFET TP whose insulated control gate is connected to an electrode GP and whose drain region is provided with a terminal DP representing an input electrode for the cell MC thus constituted, another such input electrode being the source terminal S. The ancillary transistor TP serves as an electronic switch giving selective access to the channel of transistor TM when its terminal GP is positively biased with reference to source terminal S. The latter, like the substrate 2 of FIG. 1, will generally be grounded.

In the specific case here considered, a logical "one" may be written in the cell MC by the application of biasing potentials of +25 V to drain terminal DP and to gate terminals GP, GE and GW. To cancel the cell charge, terminals DP and GP (or at least one of them) as well as GW are grounded while terminal GE is biased to +25 V. For reading, terminal GP is biased to +12 V to turn on the switching transistor TP while reading voltages are applied to gate terminals GE and GW; these reading voltages should lie between the conduction thresholds of the discharged and the charged cell which may have respective values of +5 V and +9 V.

Figure 3:
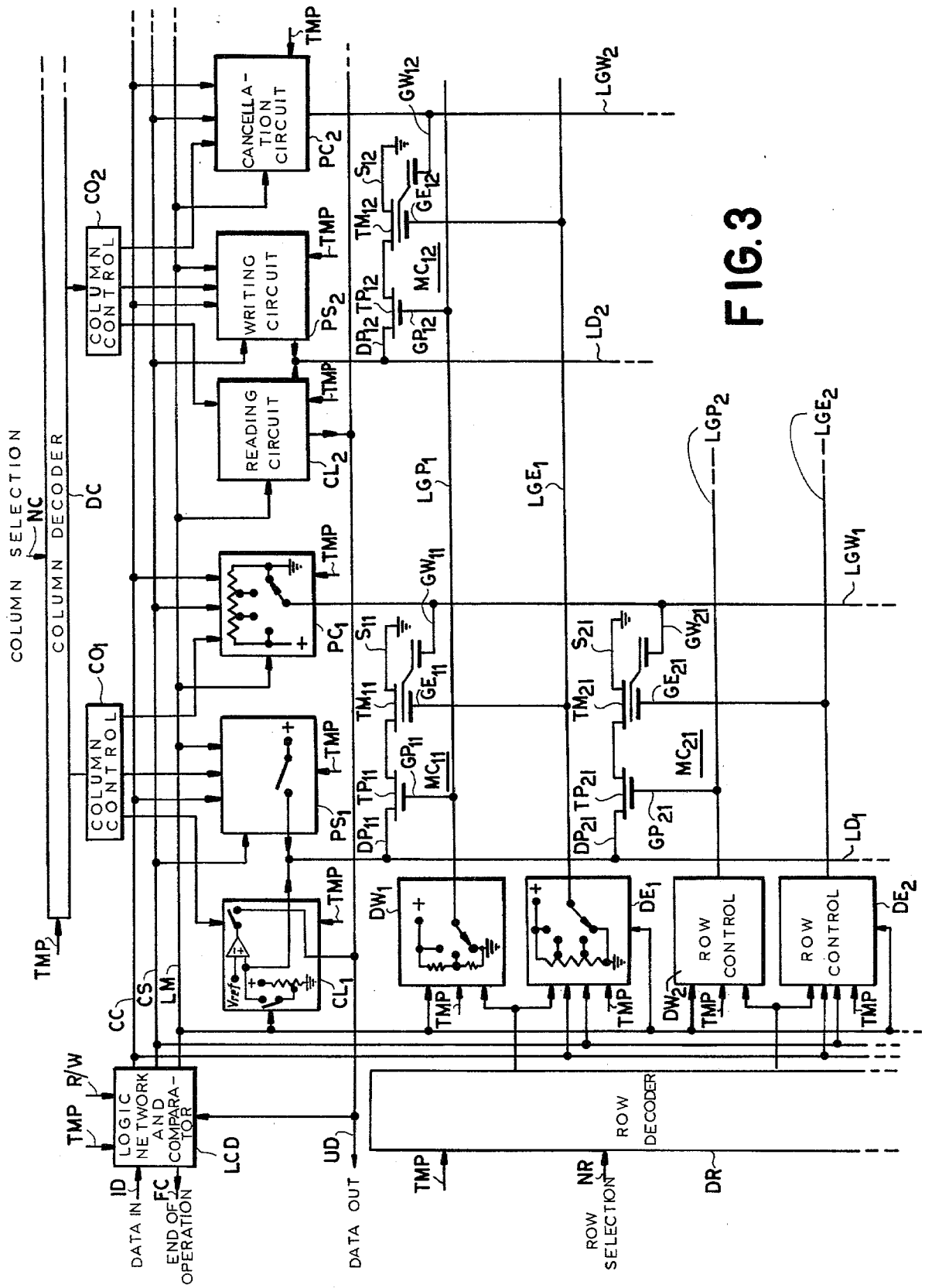
FIG. 3 is a circuit diagram of a nonvolatile memory comprising an orthogonal array of cells of the type shown in FIG. 2.

In FIG. 3 we have depicted a representative portion of a nonvolatile electronic memory incorporating a multiplicity of identical cells of the type shown in FIG. 2, these cells being arrayed in an orthogonal matrix organized in rows and columns. For the sake of simplicity, only three such cells $MC_{11}$, $MC_{12}$ and $MC_{21}$ have been illustrated. Cell $MC_{11}$, lying at the intersection of the first row and the first column, comprises a floating-gate IGFET $TM_{11}$, the two IGFETs in series with a switching IGFET $TP_{11}$ having a grounded source lead $S_{11}$, a drain lead $DP_{11}$ and gate leads $GP_{11}$, $GE_{11}$ and $GW_{11}$. Cell $MC_{12}$, included in the first row, and cell $MC_{21}$, included in the first column, comprise respective floating-gate IGFETs $TM_{12}$ and $TM_{21}$ and switching IGFETs $TP_{12}$ and $TP_{21}$ with grounded source leads $S_{12}$ and $S_{21}$, drain leads $DP_{12}$ and $DP_{21}$, and gate leads $GP_{12}$, $GE_{12}$, $GW_{12}$ and $GP_{21}$, $GE_{21}$, $GW_{21}$.

All drain leads and all writing-gate leads of a column are interconnected by common conductors designated $LD_1$, $LGW_1$ for the first column and $LD_2$ and $LGW_2$ for the second column. Similarly, all control-gate leads and all cancellation-gate leads of a row are interconnected by common conductors designated $LGP_1$, $LGE_1$ for the first row and $LGP_2$, $LGE_2$ for the second row. Reading circuits $CL_1$, $CL_2$ . . . serve for the selective energization of conductors $LD_1$, $L_2$ . . . whereas conductors $LGW_1$, $LGW_2$ . . . are energizable by respective cancellation circuits $PC_1$, $PC_2$ . . . . These circuits respond to signals from respective column controllers $CO_1$, $CO_2$ . . . which in turn are individually addressable by a column decoder DC in response to selection signals NC from a nonillustrated external control unit. Similarly, conductors $LGP_1$, $LGP_2$ . . . and $LGE_1$, $LGE_2$ . . . are respectively energizable by first and second row controllers $DW_1$, $DW_2$ . . . and $DE_1$, $DE_2$ . . . addressable by a row decoder DR in response to selection signals NR from the external unit. A logic network LCD, which has comparison and decision functions, has output leads CC, CS and LM extending to cancellation circuits $PC_1$, $PC_2$ . . . and writing circuits $PS_1$, $PS_2$ . . . as well as to all row controllers; lead LM is also connected to reading circuits $CL_1$, $CL_2$ . . . . These three leads further extend to row controllers $DE_1$, $DE_2$ . . . . All the blocks shown in FIG. 3 can also receive an enabling signal TMP from a timing circuit included in the external control unit.

Reading circuits $CL_1$, $CL_2$ . . . have output connections to a data lead UD whose voltage level indicates the state of charge of a cell to which a reading signal is selectively applied as more fully described hereinafter. Lead UD has a branch extending to logic network LCD for binary comparison of that output voltage with a two-level control voltage ID applied to a data input thereof. Network LCD further receives a read/write signal R/W and emits and end-of operation signal FC when its comparator detects logical identity between the control voltage ID and the output voltage appearing on lead UD upon the reading of a cell. In the presence of signal TMP, leads CS and CC are respectively energized in the high-level and low-level states of this control voltage.

Writing circuits $PS_1$, $PS_2$ . . . are simple electronic switches, as particularly illustrated for block $PS_1$, which applies high voltage (of +25 V according to the example given with reference to FIG. 2) to the associated conductors $LD_1$ etc. upon being so instructed by a command from decoder DC (via the respective column controller). Row controllers $DW_1$, $DW_2$..., as particularly illustrated for block $DW_1$, each comprise an electronic selector switch adapted to connect the associated conductor $LGP_1$ etc. to ground, to high voltage or to an intermediate voltage, according to the state of energization of lead LM. Reading circuits $CL_1$ etc. each include, as particularly illustrated for block $CL_1$, an electronic switch in series with a voltage divider. These reading circuits have output connections to data lead UD and to the same column conductors $LD_1$ etc. as the associated writing circuits $PS_1$ etc. but need not be isolated from the latter since they operate at different times. The cancellation circuits $PC_1$, $PC_2$ . . . and the remaining row-control circuits $DE_1$, $DE_2$ . . . , as particularly illustrated for blocks $PC_1$, and $DE_1$, each comprise and electronic selector switch adapted to connect the associated column conductor $LGW_1$ etc. or row conductor $LGE_1$ etc. to ground, to high voltage or to either of two intermediate voltages available at a pair of taps of a potentiometer, according to the state of energization of leads CC, CS and LM.

The programming or reprogramming of the memory of FIG. 3 in accordance with our invention will now be described with particular reference to cell $MC_{11}$. When it is desired to write a logical "one" in that cell, read-/write signal R/W is set at its high level, as is the control voltage ID at the data input of logic network LCD, and enabling signal TMP is generated whereupon network LCD energizes its output lead LM to a low level so as to initiate a reading step. Cell $MC_{11}$ is selected for this operation by closure of the switches of blocks $CL_1$ and by setting the selector switch of back $DW_1$ in its intermediate position with resulting energization of drain and gate leads $DP_{11}$ and $GP_{11}$ whereby transistor $TP_{11}$ is rendered conductive to the exclusion of corresponding transistors of all other cells of the memory. Voltage on lead LM activates row controllers $DW_1$, $DE_1$ as well as reading and cancellation circuits $CL_1$, $PC_1$. The selector switch of block $PC_1$ now connects conductor $LGW_1$ to an intermediate voltage avialable at one of the taps of the associated potentiometer. In a similar manner, an intermediate voltage is applied to conductor $LGE_1$ by the selector switch of circuit $DE_1$.

If the selected cell $MC_{11}$ happens to be already charged, its IGFET $TM_{11}$ will not conduct in response to the reduced reading voltages applied by blocks $DE_1$ and $PC_1$ to gate leads $GE_{11}$ and $GW_{11}$, respectively, which are lower than the conduction threshold of the cell. In that case the voltage on output lead UD is high and the comparator in network LCD immediately emits the end-of-operation signal PC which terminates the operation by causing discontinuance of the enabling signal TMP.

If, on the other hand, no charge is stored in cell $MC_{11}$, the voltage on lead UD is substantially zero. As the operation continues, the switchover signal on lead LM changes to its high or "work" level whereby the left-hand switch of block $CL_1$ is opened, the switch of block $PS_1$ is closed and the switches of blocks $PC_1$, $DW_1$ add $DE_1$ engage the high-voltage terminals of their potentiometers. As a result, drain lead $DP_{11}$ and gate leads $GP_{11}$, $GE_{11}$, $GW_{11}$ are all at the potential of +25 V and the floating gate of transistor $TM_{11}$ collects electrons from the associated channel. In accordance with our preferred mode of operation, this writing step lasts only long enough to raise the conduction threshold of the cell to a value less than the minimum level representing its charged state. When the signal on lead LM goes low, the aforedescribed reading step is repeated and, as the comparator of network LCD still finds the output voltage on lead UD to be zero, is followed by another writing step. After a sufficient number of recurrences of this sequence the output voltage changes to a high level whereupon signal FC appears and terminates the writing operation.

In an analogous manner, a cancellation command—represented by a low-level control voltage ID in the presence of an enabling signal TMP—produces an initial reading step to determine the state of charge of the selected cell. In the case of the previously loaded cell $MC_{11}$, the disparity of the output and control voltages detected by network LCD causes the energization of lead CC when signal on lead LM switches over to its "work" level. With lead LM energized, the aforementioned switches of blocks $CL_1$ and $PS_1$ are open, the switches of blocks $PC_1$ and $DW_1$ are grounded and the switch of block $DE_1$ again applies a biasing potential of +25 V to gate lead $GE_{11}$. As in the case of a writing step, the duration of this cancellation step is insufficient to reverse completely the state of charge of transistor $TM_{11}$, i.e. to lower the conduction threshold of cell $MC_{11}$ to the maximum level representing the absence of a logical "one". On the subsequent changeover of the signal on lead LM to its "read" level, therefore, network LCD still detects a disparity between the output and control voltages so that the operation continues with as many repetitions of the cancellation and reading steps as are necessary to discharge the cell.

In the system of FIG. 3 it is assumed that the switches of writing circuits $PS_1$ etc. are closed upon energization of lead CS in the case of a selected column and of lead CC in the case of an unselected column. This insures that only the selected cell of a row (whose writing-gate lead is grounded) will respond to the cancellation voltage applied to, say, the conductor $LGE_1$.

It should be noted, however, that our invention is also applicable to memories in which all cells of a row are discharged simultaneously, preparatorily to selective reloading, provided that these cells have similar histories so that the state of charge of one cell substantially equals, and is representative of, the state of charge of all other cells of that row in a cancellation operation. Reference in this connection is made to our copending application Ser. No. 168,561 of even date. In such a case, of course, column conductors $LD_1$ etc. and row conductors $LGP_1$ etc. may all be open-circuited or grounded during a discharge step.

Advantageously, the gate voltages appearing during the reading steps on conductors $LGW_1$ and $LGE_1$ are higher during a loading operation than during an unloading operation. Thus, the switches of blocks $PC_1$ and $DE_1$ are positioned on the more positive intermediate taps of their potentiometers by the joint energization of leads LM and CS but engage the more negative taps when leads LM and CC are concurrently energized. With a conduction threshold of not more than, say, +5 V for the discharged cell and not less than, say, +9 V for the charged cell, as mentioned above, the potentials of these taps may be +5.1 V and +8.9 V, respectively.

Figure 4A:
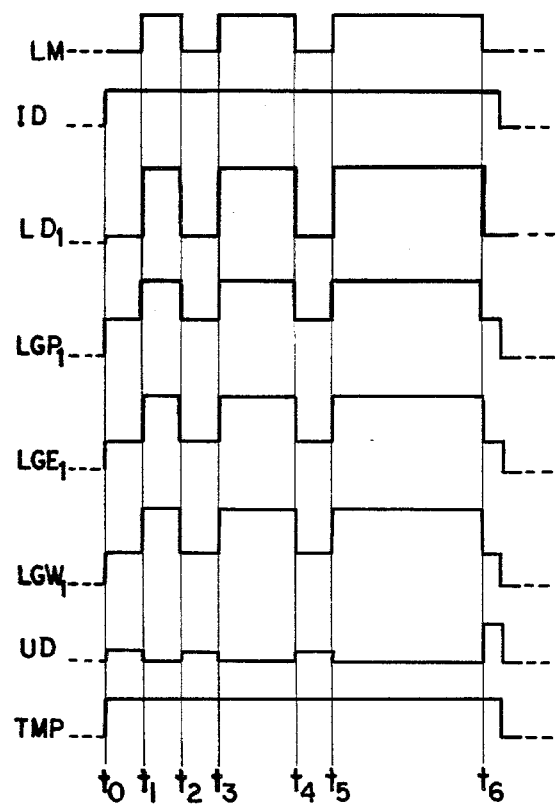
FIGS. 4A and 4B are two sets of graphs relating to the reprogramming of a selected cell of the memory of FIG. 3 according to one aspect of our invention.
Figure 4B:
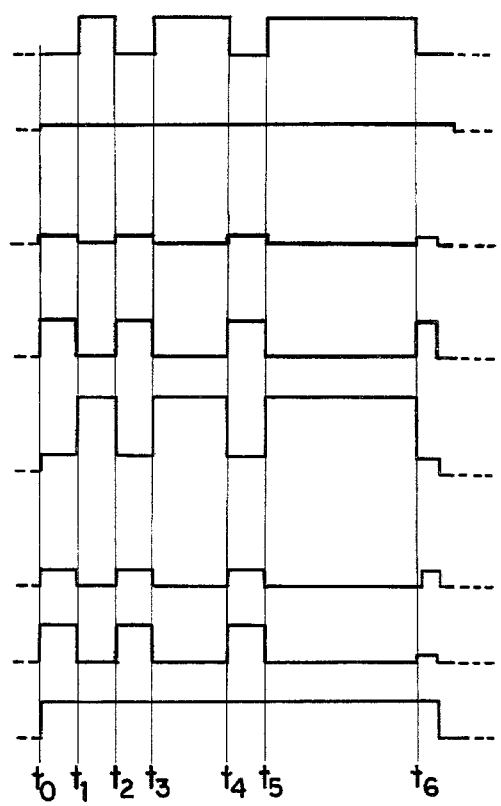

In the aforedescribed operations the switchover signal on lead LM may be a square wave with a 50% duty ratio and a half-cycle of about 10 μsecs. In FIGS. 4A and 4B, however, we have diagrammatically represented a mode of operation in which the "work" periods of that signal progressively increase. The graphs of FIG. 4A show signals ID and TMP together with the state of energization of conductors LM, $LD_1$, $LGP_1$, $LGE_1$, $LGW_1$ and UD for a writing operation while those of FIG. 4B have the same significance for a cancellation operation.

In FIG. 4A the enablin signal TMP comes into existence at an instant $t_0$ while the switchover signal on lead LM is low. During the ensuing 10-μsec period, ending at an instant $t_1$, lead $LD_1$ is energized but carries a near-zero voltage because of the very low resistance of the discharged cell; the same near-zero voltage appears on output lead UD during this reading step. Conductor $LGP_1$ is at an intermediate voltage during this writing period. When the signal on lead LM goes high in the following charging period $t_1$-$t_2$, likewise of 10 μsecs, conductors $LD_1$, $LGP_1$, $LGE_1$ and $LGW_1$ are at full potential whereas output lead UD is cut off. On the next reading step, lasting as long as the first one, the conduction threshold has risen but the voltage on lead UD is still low and does not yet match the control voltage ID. Thus, another charging step lasting twice as long as the first one occurs in a period $t_3$-$t_4$. Reading is then again carried out in a 10-μsec period $t_4$-$t_5$ and, even though the conduction threshold of the cell has risen still higher, reveals a continuing disparity between output and control voltages. There follows a further charging step, lasting for a 40-μsec period $t_5$-$t_6$, which brings up the output voltage to a high level. As a result, the end-of-operation signal FC (FIG. 3) is generated in the next reading step and terminates the enabling signal TMP while resetting all circuits to zero.

The cancellation operation represented by FIG. 4B proceeds similarly, with 10-μsec reading steps $t_0$-$t_1$, $t_2$-$t_3$, $t_4$-$t_5$ followed by respective discharging steps of 10, 20 and 40 μsecs. At instant $t_6$ the output voltage is at a near-zero level, matching that of control voltage ID, with resulting termination of enabling signal TMP.

Figure 5:
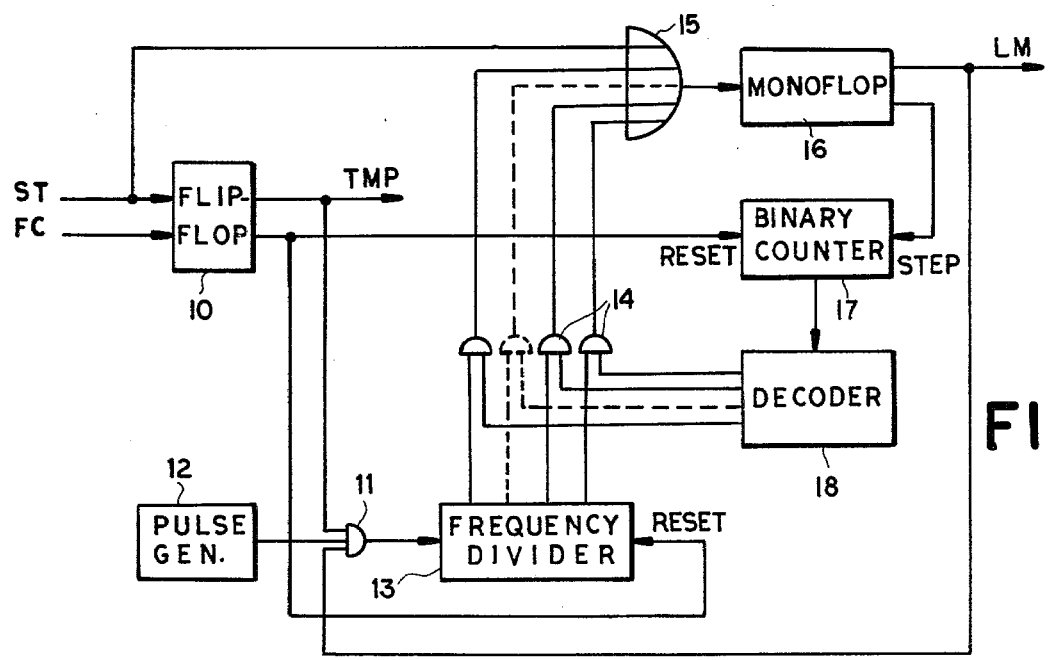
FIG. 5 is a block diagram of a voltage supply usable with the mode of operation represented by the graphs of FIGS. 4A and 4B.

In FIG. 5 we have illustrated a control unit adapted to generate the enabling signal TMP and the switchover signal on lead LM for the mode of operation described with reference to FIGS. 4A and 4B. The control unit comprises a flip-flop 10 which is set by a start pulse ST to emit the signal TMP at its set output. This output is also connected to one input of an AND gate 11 whose second input receives high-frequency pulses, e.g. at a cadence of 800 KHz, from a square-wave oscillator 12. The pulse rate is stepped down in a binary frequency divider 13 with several stage outputs carrying respective pulse cadences of 100, 50, 25 etc. KHz. These stage outputs pass by way of individual AND gates 14 into a common OR gate 15 also receiving the starting pulse ST. A monoflop 16, tripped by the leading edge of any pulse traversing the OR gate 15, emits the switchover signal of lead LM on its normal output and steps a binary counter 17 on switching to its off-normal condition. Counter 17 works into a decoder 18 having output leads connected to second inputs of respective AND gates 14. The normal output of monoflop 16 is also connected to a third input of AND gate 11 whereby pulse generator 12 drives the frequency divider 13 only when that monoflop is not tripped. Thus, with the off-normal period of monoflop 16 lasting 10 μsecs, the arrival of a start pulse ST initiates the first reading step after which the frequency divider 13 counts eight pulses before energizing one input of the first AND gate 14 whose other input is simultaneously energized by the decoder 18. This again trips the monoflop 16 and advances the counter 17 whereby the second AND gate 14 is unblocked to conduct when, after the reopening of AND gate 11, sixteen further pulses are emitted by generator 12, and so on. The appearance of the termination signal FC resets the flip-flop 10 and, with it, the counter 17.

The mode of operation represented by the graphs of FIGS. 6A and 6B differs from that of FIGS. 4A and 4B in that periods $t_1$-$t_2$, $t_3$-$t_4$, $t_5$-$t_6$, $t_7$-$t_8$, $t_9$-$t_{10}$ set aside for the writing or cancellation steps have the same duration (e.g. of 10 μsecs) as those of the preceding and intervening reading steps but that the biasing potential on conductor $LGW_1$ (FIG. 6A) or on conductor $LGE_1$ (FIG. 6B) increases progressively after each reading step. For this purpose it is, of course, necessary that the switch of block $PC_1$ connect the conductor $GW_{11}$, during a charging operation, to a supply of varying voltage in lieu of the high-voltage terminal (+) and that conductor $LGE_1$ be connected to a similar voltage supply by the switch of block $DE_1$ during a cancellation operation. Such a voltage supply may be a ramp generator 22, FIG. 7, which is periodically activated by a pulse generator 21 producing a square wave with a frequency of, say 50 KHz whenever a flip-flop 20 is set by a start pulse 20 to emit the enabling signal TMP while the switchover signal on lead LM appears in the output of the pulse generator; when the latter signal is low during a reading step, the ramp voltage $V_r$ produced by generator 22 does not charge. The termination signal FC resets the flip-flop 20 and, through it, the ramp generator 22.

It will be apparent that the ramp generator 22 could also be used in the control unit of FIG. 5 for activation by the signal on lead LM from monoflop 16 and resetting by flip-flop 10 whereby both the duration of the writing or cancellation steps and the magnitude of the gate-biasing potentials used in these steps will be progressively increased in the course of a charge-modifying cycle.

From FIGS. 4A, 4B and 6A, 6B it will further be noted that the potential of gate conductors $LGE_1$ and $LGW_1$ during reading steps is higher for a writing operation (FIGS. 4A and 6A) than for a cancellation operation (FIGS. 4B and 6B). These voltage variations, of course, apply only to the reprogramming operations; during normal reading of the memory, the gate leads of a selected cell will have to be connected to terminals with voltages of some intermediate value, e.g. of +7 V.

We claim:

1. A method of programming a nonvolatile electronic memory with a multiplicity of cells each producing, in response to a reading signal applied thereto, an output voltage depending upon the magnitude of a charge which is individually variable, by the application of charge-modifying potentials thereto, between a first absolute value not greater than a predetermined lower level and a second absolute value not less than a predetermined upper level, comprising the steps of:

(a) applying to a selected cell, in the presence of a binary control voltage, a reading signal to determine whether a significant difference exists between said control voltage and said output voltage;

(b) applying to the selected cell, upon detecting such a significant difference, a charge-modifying potential for a time sufficient to bring said output voltage closer to said control voltage;

(c) repeating step (a), followed by step (b) if said difference persists, and continuing in like manner until said difference substantially disappears, the time of application of said charge-modifying potential being progressively lengthened with successive recurrences of step (b); and (d) generating a termination signal upon the substantial disappearance of said difference.

2. A method of programming a nonvolatile electronic memory with a multiplicity of cells each producing, in response to a reading signal applied thereto, an output voltage depending upon the magnitude of a charge which is individually variable, by the application of charge-modifying potentials thereto, between a first absolute value not greater than a predetermined lower level and a second absolute value not less than a predetermined upper level, comprising the steps of:

(a) applying to a selected cell, in the presence of a binary control voltage, a reading signal to determine whether a significant difference exists between said control voltage and said output voltage;

(b) applying to the selected cell, upon detecting such a significant difference, a charge-modifying potential for a time sufficient to bring said output voltage closer to said control voltage;

(c) repeating step (a), followed by step (b) if said difference persists, and continuing in like manner until said difference substantially disappears, the magnitude of said charge-modifying potential being progressively increased with successive recurrences of step (b); and (d) generating a termination signal upon the substantial disappearance of said difference.

3. A method as defined in claim 1 or 2 wherein the time of application and the magnitude of said charge-modifying potential during the first occurrence of step (b) are chosen to be less than those required for a changeover of said output voltage between said first value and said second value.

4. A method as defined in claim 1 or 2 wherein said charge-modifying potentials, applied in step (b) to an electrode of the selected cell, are of relatively large absolute magnitude for a charge-increasing operation and of relatively small absolute magnitude for a charge-reducing operation, said reading signal including a reference pulse of intermediate absolute magnitude applied in step (a) to said electrode, said intermediate absolute magnitude being higher for a charge-increasing operation than for a charge-reducing operation.

5. A method as defined in claim 1 or 2 wherein each cell includes a floating-gate field effect transistor with an input electrode, an accessible writing gate and an accessible cancellation gate, said charge-modifying potential being applied to at least one of said accessible gates, said reading signal being applied to said input electrode and to both said accessible gates.

* * * * *